United States Patent [19]
Colas et al.

[11] Patent Number: 4,987,094
[45] Date of Patent: Jan. 22, 1991

[54] METHOD OF MAKING A MACROSCOPIC STEPPED STRUCTURE ON A VICINALLY CUT CRYSTAL

[75] Inventors: Etienne G. Colas, Asbury Park; Herbert M. Cox, Berkeley Heights, both of N.J.

[73] Assignee: Bell Communications Research, Inc., Livingston, N.J.

[21] Appl. No.: 360,416

[22] Filed: Jun. 2, 1989

[51] Int. Cl.$^5$ .............................................. H01L 21/20
[52] U.S. Cl. ........................... 437/81; 148/DIG. 95; 148/33.2; 156/610; 437/90; 437/129; 437/133; 437/946
[58] Field of Search ..................... 148/DIG. 3, 25, 50, 148/56, 65, 95, 97, 110, 115, 169, 33-33.2; 156/610-614; 437/81, 82, 89, 90, 105, 107, 108, 110, 112, 126, 129, 127, 133, 946, 970

[56] References Cited

U.S. PATENT DOCUMENTS

| | | | |
|---|---|---|---|
| 4,261,771 | 4/1981 | Dingle | 437/106 |
| 4,574,093 | 3/1986 | Cox | 427/248.1 |
| 4,645,689 | 2/1987 | Cox | 156/613 |
| 4,707,216 | 11/1987 | Morkoc et al. | 156/610 |

OTHER PUBLICATIONS

Decker et al., "Arsenic Terminated Silicon and Germanium Surfaces . . . ," J. Microscopy, vol. 152 pt. 1, Oct. 1988, pp. 157-165.
Cavrilyuk et al., "Diffusive Mass Transfer on the <111> and (100) Surfaces . . . ", Sov. Phys. Crystallogr, vol. 26, No. 3, May/Jun. 1981, pp. 317-322.
R. Bhat et al, "Patterned Quantum Well Heterostructures Grown by OMCVD on Non-Planar Substrates: Applications to Extremely Narrow SWQ Lasers," Journal of Crystal Growth, 1988, vol. 93, 850-856.
E. Kapon et al, "Lateral Patterning of Semiconductor Superlattice Heterostructures by Epitaxial Growth on Nonplanar Substrates," appearing in Growth of Compound Semiconductor Structures, Proceedings of SPIE, vol. 944, pp. 80-91.
P. M. Petroff et al, "Structure of AlAs-GaAs Interfaces Grown on (100) Vicinal Surfaces by Molecular Beam Epitaxy," Applied Physics Letters, 1984, vol. 45, pp. 620-622.
J. M. Gaines et al, "Molecular-Beam Epitaxy Growth of Tilted GaAs/AlAs Superlattices by Deposition of Fractional Monolayers on Vicinal (001) Substrates," Journal of Vacuum Science and Technology B, 1988, vol. B6, pp. 1378-1381.
K. Wada et al, "Cathodoluminescence Study of Substrate Offset Effects on Interface Step Structures of Quantum Wells," Applied Physics Letters, 1989, vol. 54, pp. 436-438.
H. M. Cox et al, "Vapor Levitation Epitaxy: System Design and Performance," Journal of Crystal Growth, 1986, vol. 79. pp. 900-908.
J. Li et al, "Photoelectrochemical Etching of Blazed Echelle Gratings in n-GaAs," Journal of the Electrochemical Society, 1988, vol. 135, pp. 3170-3171.
K. Kato et al, "AlGaAs Epitaxial Growth on (111)B Substrates by Metalorganic Vapor-Phase Epitaxy," Journal of Applied Physics, 1989, vol. 65, pp. 1947-1951.
K. Yamaguchi et al, "Lateral Growth on {111} B GaAs Substrates by Metalorganic Chemical Vapor Deposition," Journal of Crystal Growth, 1989, vol. 94, pp.203-207.

Primary Examiner—Olik Chaudhuri
Assistant Examiner—William Bunch
Attorney, Agent, or Firm—James W. Falk; Charles S. Guenzer

[57] ABSTRACT

A semiconductor structure having a face with macroscopic parallel steps and its method of making. The structure is formed by cutting a face on a crystal at a vicinal angle, that is, being misoriented from a major crystal face by a few degrees. Atomic sized microsteps are formed in the vicinal face. Parallel grooves or other regular irregularities are etched in the vicinal face. Subsequent epitaxial growth causes the microsteps to coalesce into macroscopic steps. Alternatively, etching or annealing can accomplish the same coalescing. Novel electronic structures can be fabricated on the stepped structure.

22 Claims, 7 Drawing Sheets

METHOD OF MAKING A MACROSCOPIC STEPPED STRUCTURE ON A VICINALLY CUT CRYSTAL

FIELD OF THE INVENTION

The invention relates generally to physical structures on the surface of a crystal. In particular, it relates to a stepped structure formed on a multicomponent semiconductor crystal, such as GaAs.

BACKGROUND OF THE INVENTION

The continued miniaturization of semiconductor devices is being blocked by limits imposed by the physics of semiconductor operation and the inability to laterally define yet smaller devices. Much interest has arisen in quantum well effects in which the dimensions are of the order of less than 50 nm for the GaAs/GaAlAs and InP/InGaAs groups of semiconductors. At this size, energy gaps can be controlled by the thickness of the regions. Quantum well layers can be fairly easily fabricated by epitaxially growing a thin semiconductor region on a semiconductor of the same crystal structure but of a higher bandgap. Quantum wires however present more promise but more difficulty. A quantum wire is a long semiconductor region with a cross-section in two dimensions of the order of 50 nm or less. A quantum wire can be used as an electrical conductor, as an optical fiber (assuming proper cladding layers) for light of energy less than the bandgap of the quantum wire or as a small laser (assuming proper charge injection) in which the lasing wavelength depends on the thickness of the quantum wire. However, standard lithographic processes have much difficulty in laterally defining such small features.

One promising technique has been developed by Elyahou Kapon of Bell Communications Research and relies on differential growth rates of different crystal faces of a binary or higher order semiconductor, such as the III-V compounds GaAs and GaAlAs having a zinc-blende crystal structure. His technique is described in a number of technical articles, such as "Patterned quantum well heterostructures grown by OMCVD on non-planar substrates: applications to extremely narrow SQW lasers" by Bhat et al appearing in Journal of Crystal Growth, volume 93, 1988 at pages 850-856 and "Lateral patterning of semiconductor superlattice heterostructures by epitaxial growth on nonplanar substrates" by Kapon et al appearing in Growth of Compound Semiconductor Structures, Proceedings of SPIE, volume 944, 1988 at pages 80-91. In general, Kapon lithographically etches a groove in a predetermined direction on a predetermined major crystal face of a GaAs crystal. The lithography limits the groove width to the order of no less than 0.3 μm even for advanced techniques, far above the dimensions for quantum effects. Subsequent layers of other III-V compounds of different electrical characteristics are epitaxially deposited in the groove and surrounding areas by techniques such as molecular beam epitaxy (MBE) or organometallic chemical vapor deposition (OMCVD). It has been observed that the growth rate of the material depends upon the crystal face upon which the material is deposited. By careful selection of the crystal faces in the groove, dependent upon the growth technique, the grown structure in and adjacent the groove can be made to have distinct lateral variations. In the above technical paper by Bhat et al, they have shown that crescent-shaped quantum wires can be grown.

The Kapon technique suffers from the disadvantage of producing quantum wires of highly irregular shape, specifically crescent-shaped. Since the bandgap depends upon the thickness, the bandgap varies over the irregular cross-section of the wire. The device characteristics are dependent on the exact dimensions of the crescent, which in turn are sensitive to growth parameters. Furthermore, the technique is limiting in that the quantum wire is formed near the bottom of the groove, thus reducing the flexibility in attaching further structure to the quantum wire.

Another technique that can grow quantum wires is the growth of epitaxial layers on vicinally cut GaAs crystals, as developed by Petroff. This technique is described in a technical article by Petroff et al entitled "Structure of AlAs-GaAs interfaces grown on (100) vicinal surfaces by molecular beam epitaxy" appearing in Applied Physics Letters, volume 45, 1984 at pages 620-622 and in another technical article by Gaines et al entitled "Molecular-beam epitaxy growth of tilted GaAs/AlAs superlattices by deposition of fractional monolayers on vicinal (001) substrates" appearing in Journal of Vacuum Science and Technology B, volume 6, 1988 at pages 1378-1381.

As illustrated in FIG. 1, a crystalline ingot of GaAs is cut into a wafer at a vicinal angle $\alpha$ with respect to the [001] direction and toward the [110] direction and the wafer is polished and cleaned. The vicinal angle is relatively small, for instance 2°. The result is a series of steps or microsteps with step sides 10 formed in a GaAs substrate 12. The step height d (0.283 nm for GaAs and 0.293 nm for GaAs and 0.293 nm for InP) is directly related to the interatomic bonding lengths, that is, it corresponds to an atomic monolayer. For known zinc-blende semiconductors, $d=a_o/2$, where $a_o$ is the cubic lattice constant. That is, in these materials a microstep is formed across a bilayer of a layer of Ga and a layer of As. Bottoms 14 of the steps are oriented along the [001] direction.

In a first crystal growth deposition, a one-half monolayer 16 of AlAs is deposited by MBE. It is important for the Petroff technique that monolayer growth proceeds from corners 18 of the steps. Control of the fractional monolayer deposition is by timing the exposure to the MBE beams. In a second crystal growth deposition, a one-half monolayer 20 of GaAs is deposited by MBE. Thereafter, the AlAs and GaAs depositions are repeated N times. There results GaAs quantum wires of a height N·d and a width $t=d/(2\cdot\tan\alpha)$. The width can be further controlled by varying the fractionality of the GaAs monolayer deposition.

The Petroff technique is thus capable of growing structures of just a few atomic lengths. However, the small scale is one of its disadvantages. If the minimal vicinal angle $\alpha$ is 0.1°, then the maximum width for one-half monolayer of the structure shown in FIG. 1 is 81 nm and the period of the structure is 162 nm. The width is acceptable but the period has an upper limit determined by the minimum vicinal angle that may be too small for integrating with lithographically defined features. The primary control over thickness and period is the vicinal angle $\alpha$. This angle is determined mechanically and not lithographically. The fractional monolayer depositions are difficult to control to exactly one-half monolayer. As the sum of the two fractional depositions departs from one monolayer, the structure of FIG. 1 becomes tilted, assuming that the fractions remain constant. For large number N of depositions, the fractions change and the structure weaves and some of the wires can disappear. The Petroff technique assumes a perfect regularity of the microsteps in the starting surface, which is hard to obtain in practice.

SUMMARY OF THE INVENTION

Accordingly, an object of the invention is to provide a technique for growing small features like quantum wires which are regular in shape.

It is a further object of the invention to provide such a technique in which the dimensions and spacings of the structures are easily controlled.

The invention can be summarized as a method and the resulting structure of fabricating a stepped structure on a multicomponent semiconductor crystal. The crystal is cut at a vicinal angle with respect to one of the main lattice planes. Parallel grooves are etched on the resultant vicinal surface with long dimensions perpendicular to the direction of misorientation. By either epitaxial growth, etching or annealing, the surface is modified so that atomic steps coalesce near the grooves with planar crystalline facets therebetween. Thereafter, epitaxial growth favoring the side of the step is used to produce unique structures whose dimensions can be controlled by the period of the etched grooves and the amount of vertical growth.

DETAILED DESCRIPTION

Figure 1:
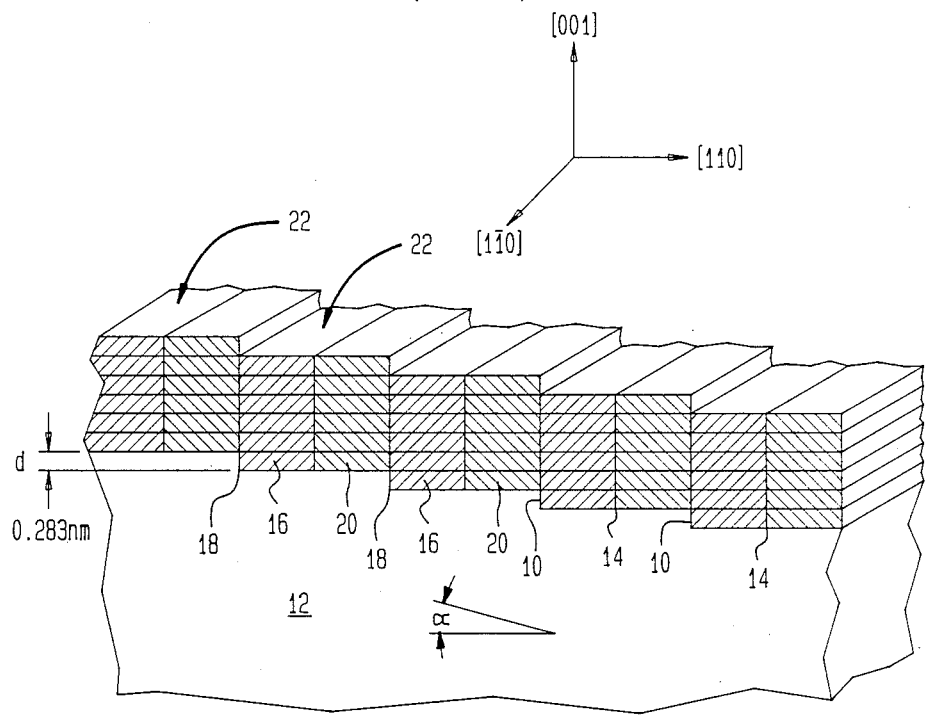
FIG. 1 is an illustration of a prior art quantum wire structure fabricated by fractional monolayer deposition on atomic steps of a vicinally cut crystal.

The present invention begins with an atomic-sized stepped structure similar to the Petroff structure of FIG. 1 but then causes many of the microscopic, atomic-sized steps to coalesce into small but macroscopic steps. A macroscopic step has a height larger than a primitive lattice vector of the crystal. The coalescing is accomplished by etching parallel grooves with long dimensions perpendicular to the direction of misorientation. Under a range of epitaxial growth or annealing conditions, the atomic-sized steps coalesce because of different growth planes exposed by the etched grooves. The resulting step has a height which is controlled by the period of the etched grooves. Wada et al in a technical article entitled "Cathodoluminescence study of substrate offset effects on interface step structures of quantum wells" appearing in Applied Physics Letters, volume 54, 1989 at pages 436–438 has disclosed a similar coalescing of microsteps on a 0.1° vicinal surface into larger macroscopic steps. However, without the patterning of the present invention, their steps are of random sizes. Kato et al have further explored this effect, as disclosed in a technical article entitled "AlGaAs epitaxial growth on (111)B substrates by metalorganic vapor-phase epitaxy" appearing in Journal of Applied Physics, volume 65, 1989 at pages 1947–1951. Kato et al reported that for OMCVD growth, if the vicinal angle is larger than 0.2°, the microsteps coalesce into macrosteps of heights 20–100 nm independent of the vicinal angle.

Figure 2:
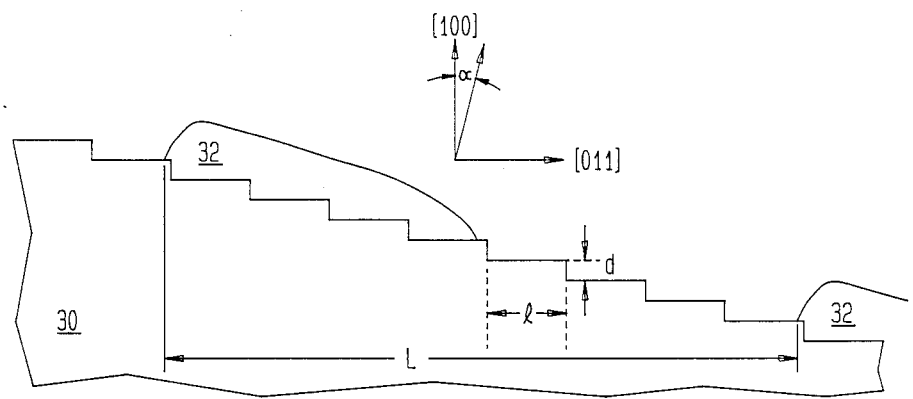
FIG. 2 is a cross-section of a vicinally cut crystal, illustrating the atomic-sized steps initially produced in the process of practicing this invention.

As illustrated in FIG. 2, a substrate 30 of, for instance, GaAs is cut, polished and cleaned at a vicinal angle $\alpha$ of 2°, for example, with respect to the [100] direction. The vicinal angle is inclined toward the [011] direction. The vicinal angle $\alpha$ should be less than 20° and is less than 10° in many applications. The minimum vicinal angle is process limited to about 0.1° at present but could possibly be extended to smaller values. The vicinal angle is taken with respect to the normal of a major (low order) crystal face (lmn) where the absolute values of l, m and n are no more than 1. Another explanation of vicinality follows. A crystal forms with smooth faces because those faces are stable or of a low energy state. Assume that a stable face has a growth rate g under some set conditions. The growth behavior that results in a stable face occurs when the growth rate g that is in the direction normal to the plane of that face is a minimum with respect to all adjacent orientations $\theta$, that is, $dg/d\theta = 0$ for the orientation of the stable plane, and increases for any small variation of the orientation $\theta$. Any closely aligned surface is vicinal to the stable face at a vicinal angle $\alpha$ if, for all intermediate orientations $\theta$ between 0 and $\alpha$, $dg/d\theta > 0$. As a result, such a vicinal surface will grow faster than the stable face until it merges into the stable face. For GaAs, InP and other zincblende multi-component semiconductors, there results a stepped structure with a monatomic (microscopic) step height of d and a step period of l. The two are related by $$\tan\alpha = d/l.$$

The illustrated structure includes a vertical step side, which is not realistic on an atomic scale.

Figure 3:
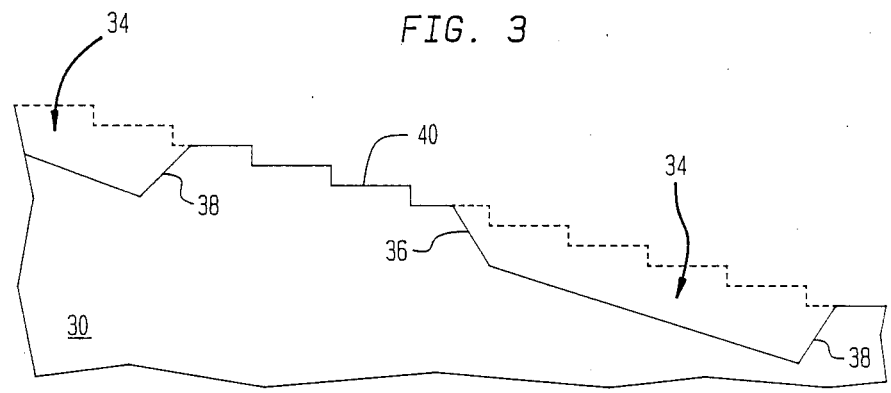
FIG. 3 is a cross-section of the crystal of FIG. 2 after the etching of the groove.

Then, a photolithographic mask 32 with grooves perpendicular to the misorientation direction $\alpha$ and with a period of L is applied. The registry of the mask 32 with the steps and the percentage of coverage by the mask 32 are relatively unimportant. Then the masked substrate 30 is etched to the extent of several step heights d. After the etching and mask removal, there results the structure of FIG. 3 in which parallel grooves 34 are formed with a period of L. The grooves 34 also expose two side walls 36 and 38, which may or may not correspond to stable growth planes, which may be the crystalline (111) faces. If this is the case, the face 36 is, for example, the (1$\bar{1}$1)A face and the face 38 is the equivalent (111)A face. A (111)A face has a Ga cation dangling bond extending perpendicularly therefrom while a (111)B has an As anion dangling bond. It has been determined that, for many zincblende semiconductors under certain growth conditions, a (111)A face can be a fast growth face relative to an adjacent (100) face. Therefore, the two faces 36 and 38 exposed in the groove 34 are fast growth surfaces relative to any (001) face exposed at the bottom of the groove 34. The distinction between fast and slow growth faces applies to all III-VI zincblende semiconductors as well as to silicon when the magnitude of the growth is orientation dependent. However the size of the growth rate ratios depends on the growth technique and growth parameters.

Figure 4:
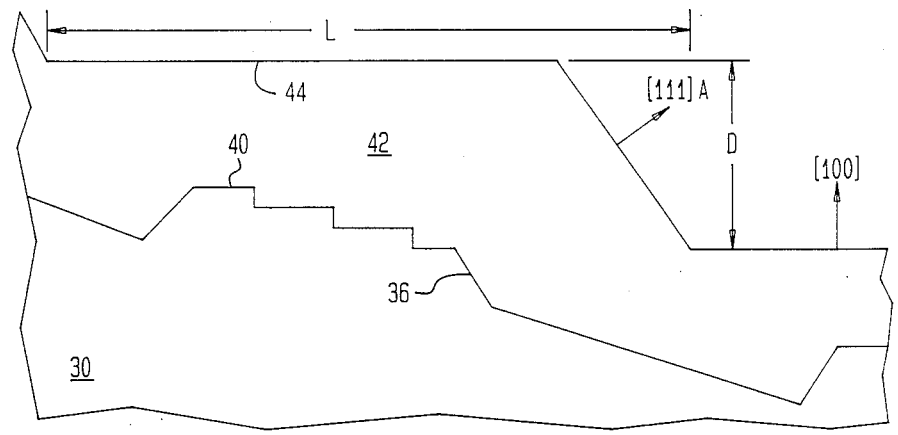
FIG. 4 is a cross-section of the macroscopically-sized step structure of the present invention.

The grooved substrate 30 is then exposed to epitaxial growth of the same material as the substrate 30 to form an overlayer 42, as illustrated in FIG. 4. It is not essential that the epitaxial growth be of the same material as long as the growth is epitaxial and provides differential growth rates. The growth proceeds for a fairly long time and does not need to be controlled to fractions of a monolayer. During the growth, because of the fast growth of the (111)A face, 36 relative to the (100) face, the atomic-sized steps and the grooves 34 disappear. There are instead formed a wide (100) face 44 approximately of width L and a (111)A face 46 forming a step of height D. The periodicity of length l in FIG. 2 has been replaced by a periodicity of length L. The new periodicity and height are related to the vicinal angle by $\tan\alpha = L/D.$ The atomic step height d has been multiplied by the factor L/l.

The stepped structure of FIG. 4 offers the following advantages. The surface lateral periodicity L is determined by the lateral periodicity L of the etched grooves 34 so that the periodicity is easily controlled. Furthermore, the vertical height D of the macroscopic steps is similarly controlled by the lateral periodicity L of the etched grooves 34, assuming that the vicinal angle $\alpha$ is constant. Thus the step heights are easily controlled and are in a range not easily achievable otherwise. The step heights and periods can furthermore be varied on the same substrate by etching multiple sets of grooves with different periods.

The above description of the invention relied upon subsequent epitaxial growth of a grooved substrate in order to coalesce the microsteps. However, as disclosed by Wada et al, it is well known that microsteps are unstable on vicinal faces and that they tend to coalesce. Therefore, annealing of the vicinally cut crystal can be used for the coalescing of the microsteps. A somewhat similar effect with etching has been disclosed by Li et al in a technical article entitled "Photoelectrochemical Etching of Blazed Echelle Gratings in n-GaAs" appearing in Journal of the Electrochemical Society, volume 135, 1988 at pages 3170-3171.

EXAMPLE 1

A first example used an InP/InGaAs semiconductor system grown by vapor levitation epitaxy.

A sulfur-doped InP substrate was vicinally cut at a nominal 2° from the (001) face toward the [$\bar{1}$11] B direction. Conventional contact lithography was used to open windows in AZ photoresist deposited on the InP substrate. Although anticipated devices would use a regular, grating-like lithographic mask, in this demonstration the mask contained closely-spaced windowstripe pairs of various widths in order to investigate the period dependence. These window stripes were aligned along the [110] direction. Parallel grooves were then etched to a depth of 0.2 $\mu$m in the masked substrate with $H_3PO_4$:HCl (20:1 by volume). After removal of the photoresist, the sample was conventionally cleaned and loaded into the vapor levitation reactor.

Vapor levitation epitaxy has been previously disclosed by Cox in his U.S. Pat. No. 4,574,093 and by Cox et al in a technical article entitled "Vapor levitation epitaxy: System design and performance" appearing in Journal of Crystal Growth, volume 79, 1986 at pages 900-908. A trichloride process variation, as disclosed by Cox et al U.S. Pat. No. 4,645,689 and in a technical article entitled "Vapor Phase Epitazial Growth of High Purity InGaAs, InP and InGaAs/InP Multilayer Structures" appearing in Journal of Crystal Growth, volume 73, 1985 at pages 523-528, was used to provide reactant gases independently to two separate reaction chambers, one for InP growth and etching and the other for InGaAs growth. Relevant reactor conditions for this example are given in Table I for the wafer etch, the InGaAs growth and the InP growth.

| Bubbler Source Material (650° C.) | $AsCl_3$(18.2° C.) In | $AsCl_3$(−11.2° C.) GaAs Hydrogen Flows (sccm) | $PCl_3$(−8.5° C.) InP |
|---|---|---|---|
| Wafer Etch | 50 | | |
| InGaAs Growth | 130 | 120 | |
| InP Growth | 100 | | 50 |

In these reactions summarized in Table I, hydrogen flows through respective trichloride bubblers at the indicated temperatures. The flows then pass over the noted source material at 650° C. All the flows are combined with hydrogen-dilute flows to result in a total flow of 1500 sccm (standard cc per minute) to the wafer, held at a growth temperature of 600° C. It is noted that for the In source material, the $H_2$/$AsCl_3$ flow is reduced to HCl+As in a separate furnace and then cooled to remove the As before the flow passes over the In source.

The growth sequence consisted of a 0.5 min etch, then 5 min InGaAs growth, followed by ten periods of 0.5 min of InGaAs and 1 min of InP growths. The superlattice of InP and InGaAs is not essential to the invention but was used to provide contrast for scanning electron microscope imaging. A final 1 min growth of InP was provided to grow a cap. The normal growth rates for an unpatterned region were 40 nm/min for InP and 10 nm/min for InGaAs.

Figure 5:
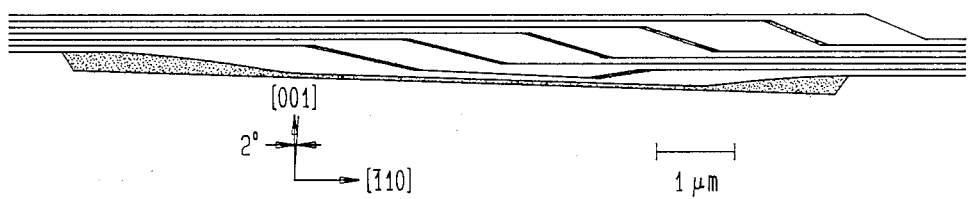
FIG. 5 is a reconstruction of an electron micrograph of a cross-section of a first example of a stepped structure of the invention.

FIG. 5 is a reconstruction of the scanning electron microscope image of the (110) cleaned and stained cross-sections of the right-hand one of the pair of grooves having a period of 11.3 μm. A pedestal of about 2 μm separates the two grooves. In the reconstruction, only every other period of the 10-period growth sequence is shown for clarity. The speckled areas correspond to InGaAs and the light areas to InP. In the electron micrographs, the InGaAs layers grown during the short repetitive periods do not visibly nucleate on the (001) surfaces but only on the step edges. The lateral growth velocities are greatly enhanced over the normal growth rates of the vicinal surfaces by about a factor of 20 for InP and of 30 for InGaAs. The measured macroscopic step height of 0.22 μm was less than the value of 0.39 μm predicted from the nominal vicinal angle. The difference may be due to a different true vicinal angle, insufficient growth to reach stability, or the inapplicability of the model to two grooves.

EXAMPLE 2

Figure 6:
FIG. 6 is a series of electron micrographs of cross-sections of the stepped structure in a second example of the invention.
Figure 6:
Figure 6:
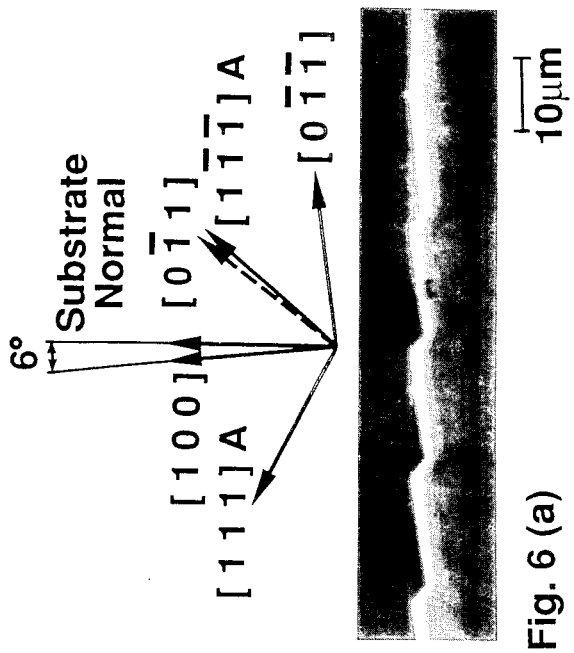
Figure 6:

A second example used a GaAs substrate which was cut near the (100) plane but at a vicinal angle of 6° toward the [0$\overline{1}$1] direction. A series of parallel trapezoidal grooves were photolithographically defined along the [01$\overline{1}$1] direction and etched with $H_2SO_4$:$H_2O_2$(30%):$H_2O$ (1:8:40 by volume). A number of these series of parallel grooves were etched with widths ranging from 3 to 20 μm. However, only the results for the 4.5 μm width are illustrated in FIG. 6. The etching produced a generally trapezoidal groove with a depth of 1.5 μm.

On this grooved substrate, a series of 3.7 nm GaAs and 5.0 nm $Al_{0.47}Ga_{0.53}$As superlattices were grown with 200 nm $Al_{0.47}Ga_{0.53}$As interlayers. The differing compositions between the superlattices and the interlayers allow for electron microscope imaging. The layers were epitaxially deposited by organometallic chemical vapor deposition (OMCVD), specifically in an atmospheric pressure, horizontal, OMCVD reactor. The group III sources were trimethygallium (TMG) and trimethylaluminum (TMA) and the group V source was arsine. OMCVD is well known and is summarized by Manasevit et al in an article entitled "The use of metalorganics in the preparation of semiconductor materials", appearing in the Journal of the Electrochemical Society, volume 116,1969 at pages 1725-1732 and by Manasevit in "Recollections and reflections of MOCVD" appearing in Journal of Crystal Growth, volume 55, 1981 at pages 1-9. The OMCVD growth was performed at 650° C. to obtain faster growth rates on the step face.

After this growth, the sample was cleaved for scanning electron microscopy (SEM). Stained SEM cross-sections at various magnifications are shown in FIG. 6, together with the relevant directions. The low-magnification electron micrograph at (a) shows the grooves in the substrate and a regular, periodic sawtooth structure having a period of 20 μm equal to the period of the grooves. The height of the macroscopic steps was 1.6 μm.

Figure 7:
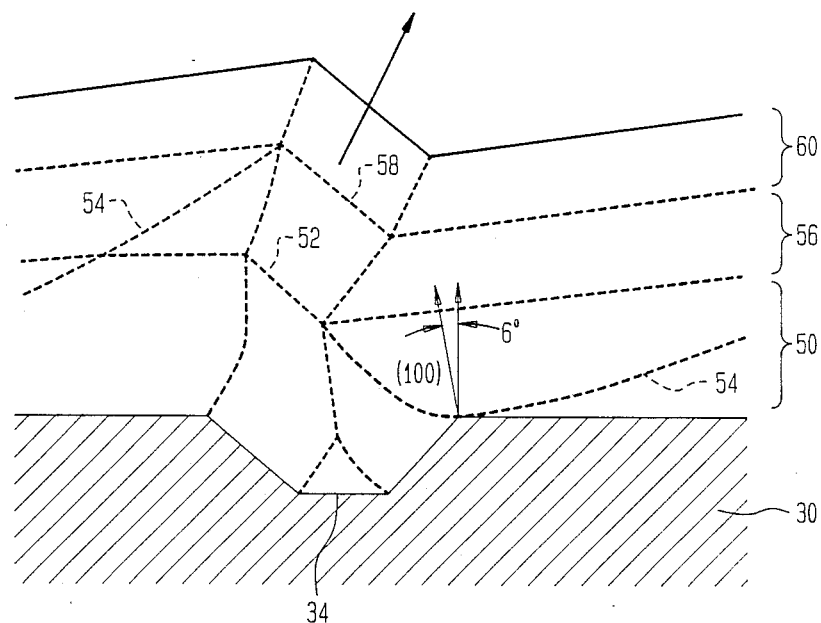
FIG. 7 is an illustration of the different stages of crystal growth, generally corresponding to the micrograph of FIG. 6(b).

The high-magnification micrograph at (b) distinguishes the different layers, both near the groove and near the step. Medium-magnification micrographs, shown at (c) and (d) further emphasize that the epitaxial growth is complex. It is noted that the periodic groove is is missing on the left for the micrograph at (c) and from the right for the photomicrograph at (d). The growth can be broken down into a number of phases, as illustrated in FIG. 7. In the step formation stage 50, the groove 34 is filling in until finally a macroscopic step 52 is formed. If there is only one groove so that the groove 34 is isolated, as shown in the micrograph at (c) in FIG. 6, this configuration will remain and the step 52 will propagate. If, on the contrary, another groove 34 is present on the left side, the (100) facet coming from the left side groove 34 will extend in a step evolution phase 56 to an interface 54 and finally meet material grown on the (111)A step 52 to form a stabilized step 58. During the step evolution phase 56, the step height is increasing. The stable step 58 is bounded by two (100) facets from adjacent grooves 34. Thereafter, in a stable growth phase 60, the step height remains nearly constant and propagates in a direction, illustrated by the arrow determined by the relative growth rates for the two exposed (100) and (111)A faces.

EXAMPLE 3

Figure 8:
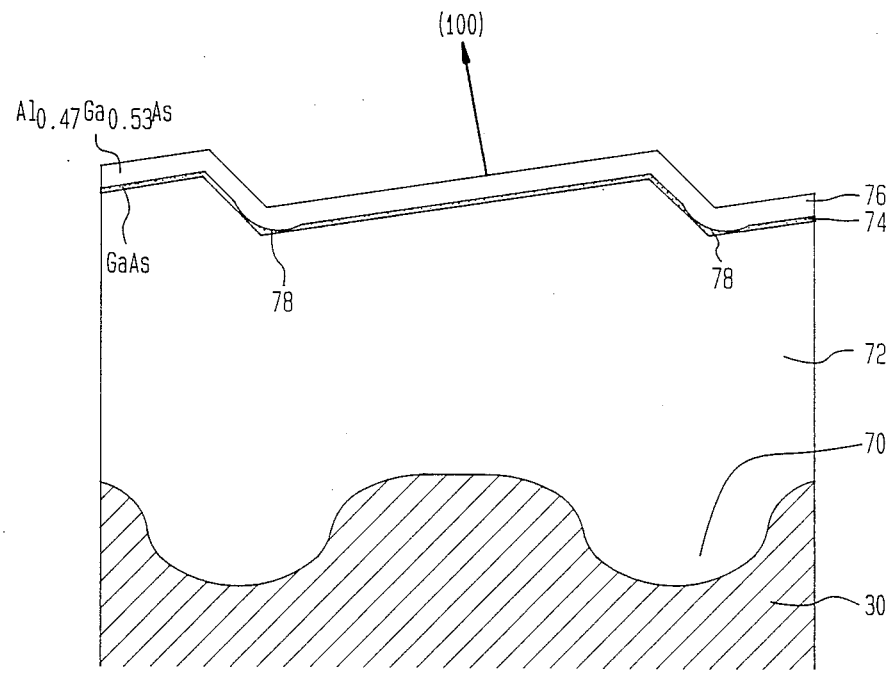
FIG. 8 is a cross-sectional view of quantum wires build on the stepped structure.

A third example used the material system of Example 2 to build an electronic structure taking advantage of the macroscopic stepped structure. Grooves 70, as illustrated in FIG. 8 were formed in the GaAs substrate 30 having a width of 1.5 μm, a depth of 0.6 μm and a period of 3.5 μm. The substrate and groove orientations were the same as in Example 2. The groove corners were relatively rounded which results from both the groove definition etch of $H_2SO_4$:$H_2O_2$(20%):$H_2O$ (1:8:40 by volume) and a pre-growth preparation etch with the same etchant components but at 20:1:1 by volume.

A buffer layer 72 of $Al_{0.47}Ga_{0.53}As$ was deposited at 750° by OMCVD, which results in small growth rate for GaAs on the step edge relative to the adjacent (100) surface. In spite of the rounded groove corners, a stabilized step was established. Thereafter a quantum well layer 74 of GaAs was deposited to a nominal thickness of 6.5 nm. Thereafter, a surface layer 76 of $Al_{0.47}Ga_{0.53}As$ was deposited. The layer thicknesses are approximately to scale in FIG. 8 except for the quantum well layer 74. Electron microscopy of the final sample revealed that the quantum well layer 74 was divided into planar portions on the (100) surfaces and the top portions of the step edges. However, thicker, crescent-shaped quantum wires 78 were formed at the concave step corners and were separated from the planar portions by much thinner connecting portions. Bright photoluminescence was observed from this structure, indicating good material quality. The luminescence from unpatterned regions of the sample away from the grooves showed a single peak corresponding in wavelength to emission from a quantum well of 10 nm in thickness. The grooved area, on the other hand, showed three luminescence peaks. The lowest energy peak was shifted by several tens of meV from the peak in the unpatterned area and is believed to correspond to emission from the wire region.

The structure of FIG. 8 can be used as a laser array in which the quantum wires 78 are the lasing active regions of the device. In this application, the substrate 30 is doped n+, the buffer layer 72 is doped n+, the quantum well layer 74 is intrinsic (undoped), and the surface layer 76 is doped p+. The substrate 30 and the surface layer 76 are used as laser electrodes.

Figure 9:
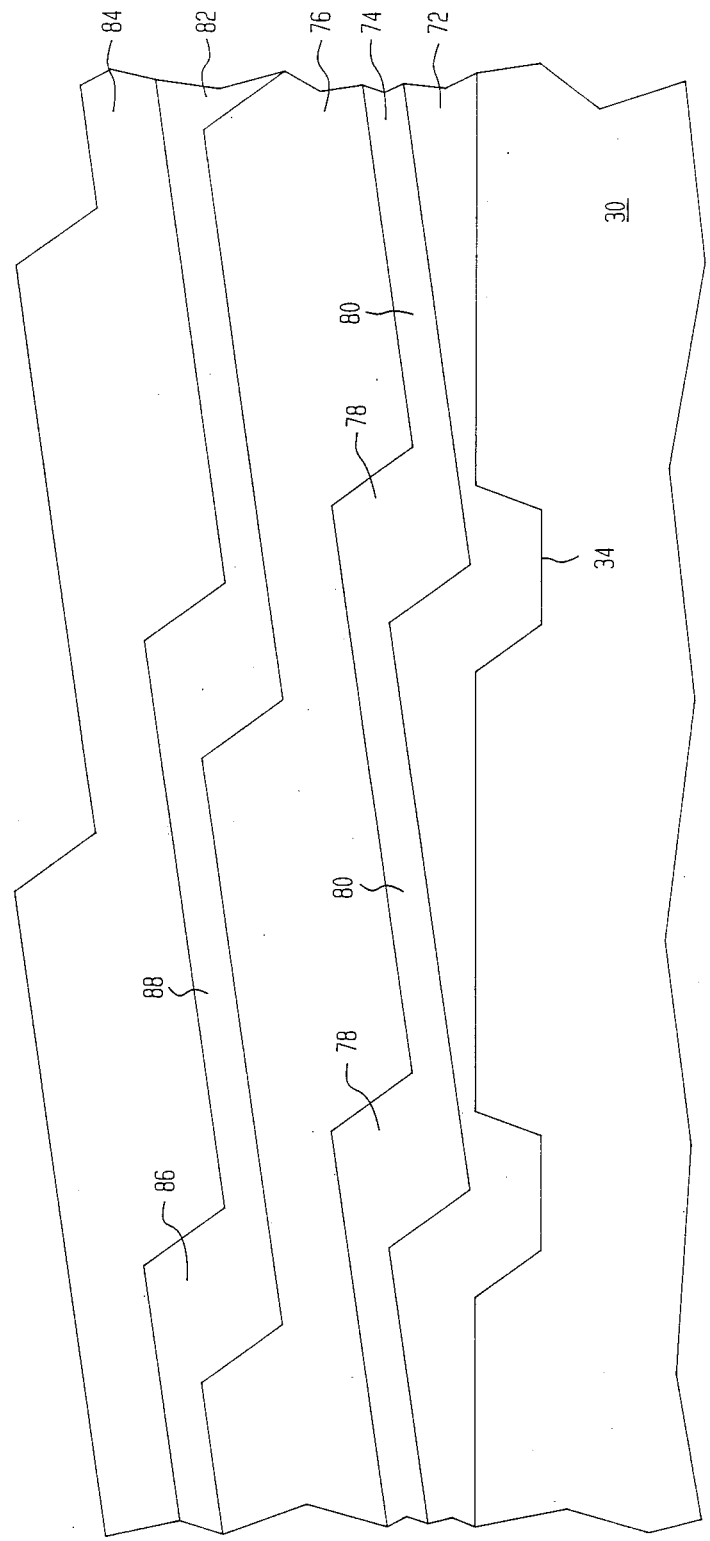
FIG. 9 is a cross-sectional view of a multilayer version of the device of FIG. 8.

It is known that the growth temperature and other processing parameters affect relative growth rates. Therefore, temperature can be used to control the shape of the structures grown with this technique. Therefore, the quantum wires 78 can be grown to have a more rectangular shape, as illustrated in FIG. 9. The quantum wires 78 are then linked by planar quantum wells 80. Furthermore, since the stepped structure persists, a multilayer structure can be grown with an additional quantum well layer 82 and another AlGaAs layer 84. Thereby, there are formed additional quantum wires 86 and quantum wells 88 at the upper level. In the early phases of growth, the height of the step is influenced by the depth of the groove and, in some situations, appears to be nearly equal to the groove depth.

Figure 10:
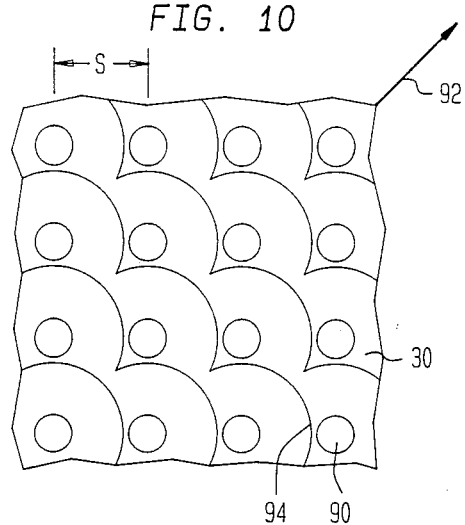
FIG. 10 is a plan view illustrating an alternate method of forming the macroscopic steps.

The previous discussion involved the use of grooves in a vicinal face in order to create macroscopic steps. However, the invention is not so limited. Many different types of periodic perturbations may be used to form kinetically favorable planes. Etched mesas define very wide grooves separated by the mesas. However, the perturbation need not even be one dimensional. As illustrated in FIG. 10, a square array of posts 90 are etched in the vicinal face of the substrate 30 misoriented along a direction 92. Each of the posts 90 provide nucleation sites for subsequent growth or rearrangement. However, the vicinal cut will favor growth along the misorientation direction. Therefore, as the microsteps coalesce, growth fronts from the various posts 90 will merge to form macroscopic steps 94. As illustrated, these macroscopic steps 94 have an arc shape arising from the two-dimensional posts 90. Eventually, the curvature will disappear as the growth front becomes a straight line. One of the advantages of the use of posts is that the posts may be lithographically defined with a rectilinear period of s, offset 45° from the misorientation direction 92 but the steps will have a period of $s/\sqrt{2}$ or 0.707·s. Therefore, the lithography limit can be effectively lowered.

Figure 11:
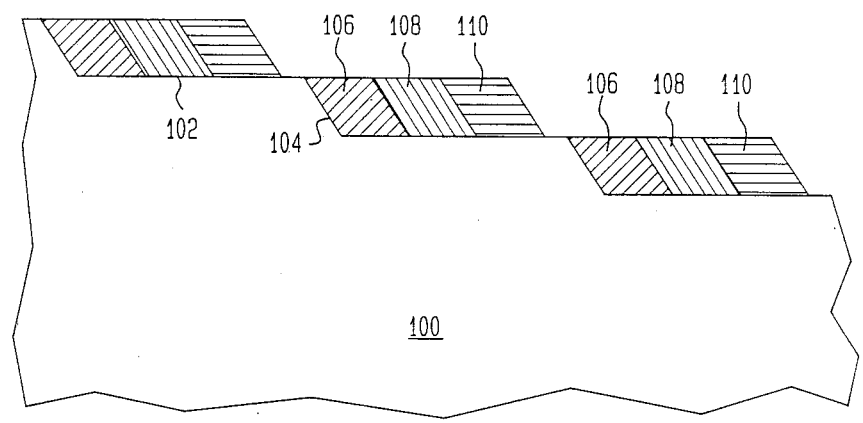
FIG. 11 is a cross-sectional view illustrating the use of the macroscopic steps to build electronic and optical devices when there is a significant difference in the growth rates.

The macroscopic steps allow a variety of novel optical or electronic (herein jointly referred to as opto-electronic) structures to be grown. Quantum wires have been discussed with respect to FIGS. 8 and 9. The use of quantum wires for lasers and waveguides is well known. Many more novel structures are possible. One generic structure is a laterally grown device which is possible when the growth rates on the two exposed faces differ substantially. As illustrated in FIG. 11, the vicinal face of a substrate 100 is patterned and then processed so as to produce a structure having macroscopic steps with major faces 102 between step faces 104. The stepped substrate 100 is a multicomponent semiconductor crystal, such as InP. Equivalent results may be obtained using the GaAs/AlGaAs group of materials. The surface electrical properties of the substrate 100 at this point are arbitrary. If it is assumed that the subsequent epitaxial growth rate on the major faces 102 is negligible compared to growth on the step faces 104, then a sequential growth of three materials A, B and C chosen from the InP/InGaAs family will produce first, second and third regions 106, 108 and 110. The lateral thicknesses are controlled by the growth times. The heights of the regions 106, 108 and 110 are equal to the height of the macroscopic steps 104. The substantial difference in growth rates has been demonstrated in Example 1 for the InP/InGaAs family grown by vapor levitation epitaxy using the substrate 100 cut at a vicinal angle with respect to the (001) face. A substantial difference should also be obtained for the GaAs/AlGaAs family grown by OMCVD if the substrate is cut at a vicinal angle to the (111)B face. The major faces 102 are then (111)B faces which do not support epitaxial growth. A similar effect has been shown for in-groove growth, as disclosed by Yamaguchi et al in a technical article entitled "Lateral growth on {111}B GaAs substrates by metalorganic chemical vapor deposition" appearing in Journal of Crystal Growth, volume 94, 1989 at pages 203–207.

If the growth is continued significantly beyond the third region 110, there results a two layer structure with an interface between the two layers. The compositions of the materials above and below the interface may be the same or be different. The electrical characteristics of the regions 106, 108 and 110 can be freely chosen within the constraints of the materials group. For both the Ga/GaAlAs and InP/InGaAs families, a wide range of characteristics are possible. For example, the substrate 100 is insulating and the second region 108 is an active region of GaAs. If the first and third regions 106 and 110 are n+ regions, then a lateral FET is produced. If, on the other hand, the first and third regions 106 and 110 are respectively n+ and p+, then a laser is produced. Additional vertical structure may be added.

From the discussion of the micrographs of FIG. 6, it is apparent that a single groove can produce a macroscopic step. The height of the step is not completely stable and corresponds to the step evolution phase 56 of FIG. 7. On this single macroscopic step, unique lateral semiconductor devices can be grown corresponding to a single step in FIG. 11.

Figure 12:
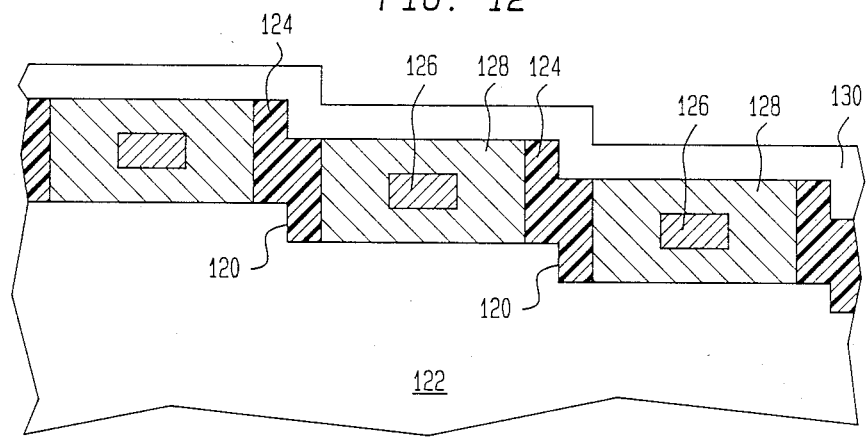
FIG. 12 is a cross-sectional view of a laser array fabricated according to the present invention.

The patterning may be achieved in both vertical and horizontal directions, as illustrated in FIG. 12 for a desirable laser structure. This figure illustrates an optimal rectilinear configuration. Macroscopic steps 120 are formed in an n+-InP substrate 122. Thereafter, selective epitaxial growth proceeds from these steps 120. Temporary interfaces are not shown in FIG. 12 for sake of clarity but every horizontal line is part of an interface. There are formed insulators 124 of semi-insulating InP, active regions 126 of $In_{1-x}Ga_xAs_{1-y}P_y$, cladding regions 128 also of $In_{1-x}Ga_xAs_{1-y}P_y$ but of a higher bandgap than the active regions 126, and a surface electrode layer 130 of p+-InP. In this structure, current is injected vertically and lases light in the active regions 126. This light is guided both vertically and horizontally by the cladding regions 128.

The present invention thus provides a new surface structure for dimensions not easily obtainable previously. The control of step height and step period can be controlled lithographically by varying the groove period. The resultant macroscopic steps provide a new tool in controlling semiconductor device fabrication.

What is claimed is:

1. A method of fabricating macroscopic steps in a crystal, comprising the steps of:
    providing a crystal of a material with a vicinal surface oriented at a vicinal angle to a major crystalline face of said crystal, microsteps thereby being formed in said vicinal surface;
    forming at least two parallel lines of similar irregularities in said vicinal surface; and
    coalescing a substantial number of said microsteps between said lines into a macroscopic step.

2. A method as recited in claim 1, wherein said coalescing comprises permitting epitaxial surface atoms on said vicinal surface to rearrange themselves.

3. A method as recited in claim 2, wherein said permitting step comprises annealing said crystal having said vicinal surface formed with said lines.

4. A method as recited in claim 2, wherein said permitting step comprises epitaxially depositing atoms on said vicinal surface formed with said lines.

5. A method as recited in claim 4, wherein said depositing step comprises vapor levitation epitaxy.

6. A method as recited in claim 4, wherein said depositing step comprises chemical vapor deposition.

7. A method as recited in claim 4, wherein said coalescing steps coalesces substantially all of said microsteps between said lines into said macroscopic step.

8. A method as recited in claim 4, wherein said lines of irregularities comprise grooves formed in said vicinal surface and wherein said forming step comprises etching said grooves in said vicinal surface.

9. A method as recited in claim 4, wherein said irregularities comprise a two-dimensional array of said irregularities protruding from said vicinal surface.

10. A method as recited in claim 9, wherein said two-dimensional array is a square array arranged along orthogonal axes and a normal to said vicinal surface and a normal to said major face lie in a plane substantially bisecting said orthogonal axes.

11. A method as recited in claim 4, further comprising fabricating an opto-electronic structure above a surface of said crystal formed with said macroscopic steps.

12. A method as recited in claim 4, wherein said vicinal angle is between 0.1° and 20°.

13. A method as recited in claim 12, wherein said vicinal angle is between 0.1° and 10°.

14. A method as recited in claim 1, wherein said providing step comprises cutting said crystal along a plane inclined at said vicinal angle with respect to said major crystalline face.

15. A method of fabricating a macroscopic step, comprising the steps of:
   providing a crystalline semiconductor substrate having a vicinal surface oriented at a vicinal angle to a major face of a crystal structure of said substrate;
   forming at least one groove in said vicinal surface; and
   epitaxially growing a semiconductor material having said crystal structure on said substrate formed with said groove to thereby form a macroscopic step in said semiconductor material in a vicinity of said groove.

16. A method as recited in claim 15, wherein said semiconductor substrate and said semiconductor material comprise multicomponent semiconductors having a zincblende crystal structure as said crystal structure and said vicinal angle is between 0.1° and 20°.

17. A method as recited in claim 16, further comprising forming an opto-electronic device over said grown epitaxial semiconductor material in a vicinity of said macroscopic step.

18. A semiconductor structure, comprising:
   a semiconductor body formed of a semiconducting material having a major crystal face;
   a vicinal planar surface formed on said semiconductor body, said vicinal surface having a normal separated from a normal of said major crystal face by an angle between 0.1° and 20°; and
   at least three macroscopic steps formed in said vicinal surface, separated by substantially equal distances, a step height of said steps being substantially equal and being a plurality of atomic distances of said crystal.

19. A semiconductor structure as recited in claim 18, wherein said vicinal angle is between 0.1° and 10°.

20. A semiconductor structure as recited in claim 18, wherein said semiconducting material comprises a multicomponent zincblende semiconductor.

21. A semiconductor structure as recited in claim 20, further comprising an opto-electronic device epitaxially formed over said macroscopic steps.

22. A semiconductor structure as recited in claim 21, wherein said device includes a quantum wire.

* * * * *

UNITED STATES PATENT AND TRADEMARK OFFICE
CERTIFICATE OF CORRECTION

PATENT NO. : 4,987,094

DATED : January 22, 1991

INVENTOR(S) : Etienne G. Colas and Herbert M. Cox

It is certified that error appears in the above-identified patent and that said Letters Patent is hereby corrected as shown below:

Column 2, line 34, "0.293 nm for GaAs and 0.293 nm for" should read --0.293 nm for--.
Column 7, line 23, "[01$\overline{11}$]" should read --[01$\overline{1}$]--;
line 64, "is is" should read --is--.

Signed and Sealed this

Twenty-first Day of July, 1992

Attest:

DOUGLAS B. COMER

Attesting Officer     Acting Commissioner of Patents and Trademarks